United States Patent [19]

Kanda et al.

[11] Patent Number: 5,393,637
[45] Date of Patent: Feb. 28, 1995

[54] PHOTOSENSITIVE COMPOSITION FOR OFFSET PRINTING COMPRISING A BINDER, A PHOTOSENSITIVE SUBSTANCE AND A MICROGEL MADE FROM AN ACRYLIC RESIN HAVING CARBOXYL GROUPS AS THE EMULSIFIER

[75] Inventors: Kazunori Kanda, Yao; Yoshifumi Ichinose, Ikeda; Seiji Arimatsu, Hirakata; Katsuji Konishi, Ibaraki; Takakazu Hase, Nishinomiya, all of Japan

[73] Assignee: Nippon Paint Co., Ltd., Osaka, Japan

[21] Appl. No.: 843,851

[22] Filed: Feb. 28, 1992

[30] Foreign Application Priority Data

Mar. 1, 1991 [JP]  Japan ................................. 3-036029

[51] Int. Cl.[6] .................. G03C 1/72; G03F 7/021; G03F 7/023; G03F 7/027
[52] U.S. Cl. ........................... 430/138; 430/157; 430/165; 430/175; 430/176; 430/190; 430/191; 430/192; 430/193; 430/278; 430/281; 430/283; 430/285; 430/288; 430/302
[58] Field of Search ............... 430/175, 176, 270, 278, 430/138, 302, 190, 191, 192, 193, 281, 288, 283, 285, 157

[56] References Cited

U.S. PATENT DOCUMENTS

| | | | |
|---|---|---|---|
| 3,895,082 | 7/1975 | Hochberg | 525/275 |
| 4,273,851 | 6/1981 | Muzyczko et al. | 430/175 |
| 4,414,278 | 11/1983 | Cohen et al. | 428/402 |
| 4,550,073 | 10/1985 | Neiss et al. | 430/273 |
| 4,551,415 | 11/1985 | Cohen et al. | 430/271 |
| 4,726,877 | 2/1988 | Fryd et al. | 428/901 |
| 4,753,865 | 6/1988 | Fryd et al. | 430/905 |
| 4,894,315 | 1/1990 | Feinberg et al. | 430/288 |
| 4,937,173 | 6/1990 | Kanda et al. | 430/286 |
| 4,956,252 | 9/1990 | Fryd et al. | 430/138 |
| 5,077,175 | 12/1991 | Fryd et al. | 430/271 |

FOREIGN PATENT DOCUMENTS

| | | |
|---|---|---|
| 356953 | 3/1990 | European Pat. Off. |
| 4024710 | 2/1991 | Germany |

OTHER PUBLICATIONS

Patent Abstracts of Japan, vol. 12, No. 107 (P-686) (2954) (1988).

*Primary Examiner*—Janet C. Baxter
*Assistant Examiner*—John S. Chu
*Attorney, Agent, or Firm*—Wenderoth, Lind & Ponack

[57] ABSTRACT

Disclosed is a photosensitive composition used for offset printing, which provides an offset printing plate with excellent durability and developability. The photosensitive composition comprises:

(I) a film-forming binder resin, (II) a photosensitive substance, and (III) a microgel having a particle size of 0.01 to 2.0 μ prepared by emulsion polymerization using a polymeric emulsifier having an Sp value of 9 to 16.

5 Claims, No Drawings

PHOTOSENSITIVE COMPOSITION FOR OFFSET PRINTING COMPRISING A BINDER, A PHOTOSENSITIVE SUBSTANCE AND A MICROGEL MADE FROM AN ACRYLIC RESIN HAVING CARBOXYL GROUPS AS THE EMULSIFIER

FIELD OF THE INVENTION

The present invention relates to a photosensitive composition for offset printing. More particularly, it relates to a photosensitive composition for offset printing wherein microgel having extremely excellent dispersion stability is added, which provides an offset printing plate having excellent durability and developability.

BACKGROUND OF THE INVENTION

Heretofore, a technique for improving wear resistance and durability of a printing plate by adding a microgel to a photosensitive resin layer for lithographic, letterpress, intaglio, and flexographic printing plates has been known.

However, in the offset printing plate, the photosensitive resin layer has extremely small thickness such as several microns and the photosensitive layer must be formed by coating a resin composition after dissolving it in an organic solvent. Thus, the following performances are considered to be necessary for a microgel to be used:

(a) The particle size of the microgel is not more than 1 micron (submicron), (b) The microgel is sufficiently dispersed in an organic solvent without aggregation or precipitation, (c) The microgel is compatible with a binder resin to homogenize or integrate.

However, it was found that, when a conventional microgel is used as a composition for the production of the offset printing plate, dispersion of particles is not necessarily sufficient and the above performances can not be satisfied.

For example, in U.S. Pat. Nos. 4,550,073 and 4,551,415, a photosensitive composition wherein a microgel synthesized by suspension polymerization is added is disclosed. However, in the stabilization of particles by a suspension stabilizer, a hydrated layer is not sufficiently formed at the particle surface in comparison with the stabilization of particles by an emulsifier in the case of emulsion polymerization. When the stirring force on polymerization is too large, there is a disadvantage that particles are aggregated, and it is unstable. Further, when synthesized particles are used by dispersing them in an organic solvent, there is a disadvantage that the microgel does not show good dispersibility to the organic solvent because the particle surface is coated with the dispersion stabilizer.

Accordingly, when such a microgel is used for the offset printing plate, dispersion stability of microparticles in organic solvent is inferior and, therefore, dispersion stability in the composition becomes inferior, whereby, a good printing plate can not be obtained. Namely, it does not show good printability and durability.

In Japanese Patent Kokai No. 63-8648, there is disclosed a photosensitive flexographic printing plate comprising a microgel. Further, in Japanese Patent Kokai No. 63-17903, there is disclosed a technique for a microgel-containing photocurable resin composition which can be applied for a printing plate wherein polymerization is initiated by irradiation of 400 to 800 nm. In both references, a microgel comprising an ampho-ionic compound as an emulsifier is disclosed.

However, since the ampho-ionic compound has normally poor compatibility with an organic solvent, a microgel synthesized from this compound also does not show good dispersibility to the organic solvent.

OBJECTS OF THE INVENTION

Under these circumstances, the present inventors have intensively studied. As a result, it has been found that the above problem can be solved by adding a microgel which is synthesized by emulsion polymerization using a specific emulsifier, and the present invention has been completed.

That is, the main object of the present invention is to provide a photosensitive composition for offset printing plate comprising a microgel which is stably dispersed in a photosensitive solution of a composition and also uniformly dispersed in a photosensitive layer, said microgel giving excellent durability on printing.

This object as well as other objects and advantages of the present invention will become apparent to those skilled in the art from the following description.

SUMMARY OF THE INVENTION

According to the present invention, there is provided a photosensitive composition for offset printing which comprises:

(I) a film-forming binder resin, (II) a photosensitive substance, and (III) a microgel having a particle size of 0.01 to 2.0 $\mu$ prepared by emulsion polymerization using a polymeric emulsifier having an Sp (Solubilty parameter) value of 9 to 16.

DETAILED EXPLANATION OF THE INVENTION

The binder resin (I) has good alkali developability and becomes a matrix of the printing plate. For example, such a binder resin (I) is that containing at least one sort of group selected from acidic groups (e.g. carboxyl group, sulfonic group, phosphoric group, etc.), ampho-ionic groups and the like at a side chain. In order to provide alkali resistance to the matrix, it is preferred that the binder resin does not have a lot of bonds which are easily affected by alkali (e.g. ester bond, etc.) at a main chain.

Examples of the binder resin (I) include acrylic resin having an acid value of 10 to 150, hydroxyl value of 1 to 250 and a molecular weight of 2,000 to 500,000 and the like.

Such an acrylic resin is an acrylic polymer which is normally used in coating industries, e.g. a copolymer of at least one alkyl ester of acrylic or methacrylic acid, or a copolymer of said monomer with at least one ethylenically unsaturated monomer and functional monomer.

As the monomer to be used, for example, they are as follows:

(I) acidic group-containing monomer (e.g. acrylic acid, methacrylic acid, crotonic acid, itaconic acid, maleic acid, maleic anhydride, fumaric acid, sodium vinylsulfonate, sodium styrene-p-sulfonate, 2-acrylamide-2-methylpropanesulfonic acid, 2-amidophosphoxyethyl methacrylate, etc.), (II) hydroxyl group-containing monomer (e.g. 2-hydroxyethyl acrylate, hydroxypropyl acrylate, 2- hydroxyethyl methacrylate, hydroxypropyl methacrylate, hydroxybutyl acrylate, hydroxybutyl methacrylate, allyl alcohol, methallyl alcohol, N-(4-hydroxyphenyl)acrylamide or N-(4-hydroxyphenyl)methacrylamide, o-, m-, p-hydroxystyrene, o-, m-, p-hydroxyphenyl acrylate or methacrylate, etc.), (III) alkyl acrylate or methacrylate [e.g. methyl (meth)acrylate, ethyl (meth)acrylate, n-butyl (meth)acrylate, propyl (meth)acrylate, acyl (meth)acrylate, cyclohexyl (meth)acrylate, octyl acrylate, 2-chloroethyl acrylate, etc.], (IV) polymerizable amide such as acrylamides or methacrylamides (e.g. acrylamide, methacrylamide, N-methylolacrylamide, N-ethylacrylamide, N-hexylacrylamide, N-cyclohexylacrylamide, N-hydroxyethylacrylamide, N-phenylacrylamide, N-nitrophenylamide, N-ethyl-N-phenylacrylamide, etc.), (V) nitrogen-containing alkyl acrylate or methacrylate (e.g. dimethylaminoethyl acrylate, dimethylaminoethyl methacrylate, etc.), (VI) vinyl ethers (e.g. ethyl vinyl ether, 2-chloroethyl vivyl ether, hydroxyethyl vinyl ether, propyl vinyl ether, butyl vinyl ether, octyl vinyl ether, phenyl vinyl ether, etc.), (VII) vinyl esters (e.g. vinyl acetate, vinyl chloroacetate, vinyl butyrate, vinyl benzoate, etc.), (VIII) styrenes (e.g. α-methylstyrene, methylstyrene, chloromethylstyrene, etc.), (IX) vinylketones (e.g. methyl vinyl ketone, ethyl vinyl ketone, propyl vinyl ketone, phenyl vinyl ketone, etc.), (X) olefins (e.g. ethylene, propylene, isobutylene, butadiene, isoprene, etc.)

(XI) glycidyl (meth)acrylate, (XII) polymerizable nitrile (e.g. acrylonitrile, methacrylonitrile, etc.), (XIII) N-vinylpyrrolidone, N-vinylcarbazole, 4-vinylpyridine, etc.), (XIV) ampho-ionic monomer (e.g. N,N-dimethyl-N-methacryloxyethyl-N-(3-sulfopropyl)-ammoniumbetaine, N,N-dimethyl-N-methacrylamidepropyl-N-(3-sulfopropyl)-ammoniumbetaine, 1-(3-sulfopropyl)-2-vinylpyridinium-betaine, etc.)

(XV) compound obtained by reacting a compound having a functional group which reacts with the above monomer (e.g. monomer produced by reacting hydroxy group-containing monomer (II) with isocyanate compound, monomer produced by reacting carboxyl group-containing monomer (I) with glycidyl group-containing compound, etc.) and the like.

In the present invention, a binder resin other than the above binder resin (I) may be appropriately used in combination. As the other suitable binder resin, there can be used alkali-soluble resin (including novolac resin). Examples thereof include phenol formaldehyde resin, cresol formaldehyde resin, p-tert-butylphenol formaldehyde resin, phenol modified xylene resin, phenol modified xylenemesitylene resin and the like. Examples of the other useful alkali-soluble resin include copolymer of polyhydroxystyrene, polyhalogenated hydroxystyrene or (meth)acrylic acid with the other vinyl compound (e.g. methyl methacrylate and the like. If necessary, there can also be used polyvinyl butyral, polyurethane resin, polyamide resin, polystyrenemaleic acid resin, epoxy resin, natural resin, or modified resin or water-solubilized modified resin thereof.

The photosensitive substance (II) to be formulated in the photosensitive composition of the present invention enables to conduct photodecomposition and photopolymerization by exposure to control alkali solubility of a plate on development, which results in the formation of an image on a substrate. In the case that the photosensitive resin composition of the present invention is prepared as the negative .type, it is preferred that the photosensitive substance (II) to be formulated is diazo resin. A condensate of an aromatic diazonium salt with an active carbonyl-containing compound (e.g. formaldehyde, etc.) which is a typical diazo resin is particularly useful. Examples of the preferred diazo resin include hexafluorophosphate salt, tetrafluoroborite salt and phosphate salt of a condensate of p-diazodiphenylamine with formaldehyde or acetaldehyde. As the counter anion of a condensate of p-diazodiphenylamine with formaldehyde, for example, sulfonate salt (e.g. p-toluenesulfonate salt, dodecylbenzenesulfonate salt, 2-methoxy-4-hydroxy-5-benzoyl benzenesulfonate salt, etc.), phosphite salt (e.g. benzenephosphite salt, etc.), hydroxy group-containing compound salt (e.g. 2,4-dihydroxybenzophenone salt, etc.) and organic carbonate salt as described in U.S. Pat. No. 3,300,309 are preferably used in combination.

Furthermore, those obtained by condensing 3-methoxy-4-diazo-diphenylamine with 4,4-bis-methoxymethyldiphenyl ether to form methylenesulfonate salt as described in Japanese Patent Kokai No. 58-27141 are also suitable.

In the case that the photosensitive resin composition of the present invention is prepared as the negative type, as the photosensitive substance (II) to be formulated, a photopolymerizable composition can also be used. The term "photopolymerizable composition" used herein means a mixture of a so-called photopolymerization initiator which forms an active radical when active rays such as ultraviolet rays are irradiated and a monomer having an ethylenically unsaturated group which is polymerized by the radical formed.

The photopolymerization initiator may be any one that is known in the art and examples thereof include benzoin, benzoin alkyl ether (e.g. benzoin methyl ether, benzoin isopropyl ether, benzoin t-butyl ether, etc.), benzophenone, benzil, benzil dimethyl ketal and the like. Those which absorb a visible ray to form a radical by the interaction with a radical forming agent are also included. As the above compounds, combination of a sensitizer and radical forming agent is known and it is, for example, disclosed in Japanese Patent Kokai No. 63-17903. The amount of the photopolymerization initiator to be used is normally about 0.01 to 80% by weight based on the weight of the photopolymerizable composition.

Examples of the monomer having an ethylenically unsaturated group to be used in combination include styrene, vinyltoluene, chrolostyrene, t-butylstyrene, α-methylstyrene, divinylbenzene, acrylic acid, methacrylic acid, methyl (meth)acrylate, ethyl (meth)acrylate, n-propyl (meth)acrylate, iso-propyl (meth)acrylate, n-butyl (meth)acrylate, iso-butyl (meth)acrylate, sec-butyl (meth)acrylate, t-butyl (meth)acrylate, 2-ethylhexyl (meth)acrylate, n-nonyl (meth)acrylate, n-decyl (meth)acrylate, lauryl (meth)acrylate, n-tridecyl (meth)acrylate, stearyl (meth)acrylate, ethylene glycol mono(meth)acrylate, propylene glycol mono(meth)acrylate, diethylene glycol mono(meth)acrylate, dipropylene glycol mono(meth)acrylate, polyethylene glycol mono(meth)acrylate having a molecular weight of 200 to 1000, polypropylene glycol mono(meth)acrylate having a molecular weight of 200 to 1000, polyethylene glycol monomethyl ether mono(meth)acrylate having a molecular weight of 200 to 1000, polypropylene glycol monomethyl ether mono(meth)acrylate having a molecular weight of 200 to 1000, polyethylene glycol monoethyl ether mono(meth)acrylate having a molecular weight of 200 to 1000, polypropylene glycol monoethyl ether mono(meth)acrylate having a molecular weight of 200 to 1000, n-butoxyethyl (meth)acrylate, phenoxyethyl (meth)acrylate, 2-phenoxypropyl (meth)acrylate, cyclohexyl (meth)acrylate, tetrahydrofurfuryl (meth)acrylate, glycidyl (meth)acrylate, allyl (meth)acrylate, benzyl (meth)acrylate, tribromophenyl (meth)acrylate, 2,3-dichloropropyl (meth)acrylate, 3-chloro-2-hydroxypropyl (meth)acrylate, N,N-diethylaminoethyl (meth)acrylate, N,N-dimethylaminoethyl (meth)acrylate, N-t-butylaminoethyl (meth)acrylate, acrylamide, N,N-dimethylacrylamide, N,N-diethylacrylamide, ethylene glycol di(meth)acrylate, propylene glycol di(meth)acrylate, 1,3-propanediol di(meth)acrylate, 1,4-butanediol di(meth)acrylate, neopentyl glycol di(meth)acrylate, 1,6-hexanediol di(meth)acrylate, polyethylene glycol di(meth)acrylate, polypropylene glycol di(meth)acrylate, glycerine di(meth)acrylate, glycerine tri(meth)acrylate, trimethylolpropane tri(meth)acrylate, trimethylolethane tri(meth)acrylate, ethylene-bis-acrylamide, diallyl phthatate, triallyl cyanurate, diethyl fumarate, dibutyl fumarate, vinyl acetate and the like.

The amount of this kind of the unsaturated monomer to be formulated is not specifically limited and is normally about 20 to 99.99% by weight, particularly 30 to 90% by weight based on the weight of the photopolymerizable composition.

Further, the photosensitive resin composition of the present invention can be prepared as those of positive type. In that case, as the photosensitive substance (II), quinonediazide resin, particularly o-quinonediazide resin is preferred. As the o-quinonediazide resin, for example, ester of sulfonylchloride of diazide (e.g. o-benzoquinonediazide, o-naphthoquinonediazide, etc.) and aromatic mono or polyhydroxyl compound is useful. Typical examples include ester of benzoquionone-1,2-diazidesulfonylchloride or naphthoquinone-1,2-diazidesulfonylchloride and phenolnovolac resin or cresolnovolac resin, ester of naphthoquinone-1,2-diazidesulfonylchloride and pyrogallol acetone resin and the like.

Examples of other useful o-quinonediadize resin include known o-quinonediazide compounds such as ester of polydiacrylmethane polymer and quinonediazide sulfonate described in Japanese Patent Kokai No. 47-5303, ester of bisphenol-formaldehyde and o-quinonediazide sulfonylchloride described in Japanese Patent Kokai No. 48-63803, condensate of polymer amine and o-quinonediazide halide described in Japanese Patent Kokai No. 48-96575, reaction product of polymer-product of styrene-monomer and phenol derivative with o-quinonediazide sulfonate described in Japanese Patent Kokai No. 49-17481 and the like.

The microgel (III) to be formulated in the photosensitive composition of the present invention improves application property of the photosensitive composition to a substrate (e.g. cratering resistance, sagging resistance, etc.), developability of photosensitive composition, printing performances of printing plate (e.g.. durability, ink resitance, etc.) and the like. Such microgel (III) used in the present invention can be produced by polymerizing an ethylenically unsaturated monomer in an aqueous solvent according to a normal emulsion polymerization method, using a specific polymeric emulsifier.

The above polymeric emulsifier has an Sp value of 9 to 16, particularly 10 to 13. The Sp value determines compatibility of the microgel with the organic solvent and binder resin, and the above range of the Sp value provides an a uniform photosensitive composition. When the Sp value is not in the above range, dispersibility of the microgel becomes inferior in a solution, which results in aggregation of the microgel or deterioration of physical properties, particularly durability.

The polymeric emulsifier in the present invention has an emulsification ability because of having acidic group hydroxyl group. As the acidic group, carboxyl group is preferred. It is preferred that-the acidic value is 15 to 100, preferably 25 to 80. The acid value has a close relation with an emulsification ability (when used as an emulsifier) and dispersion stability of the microgel. When the acid value is less than 15, dispersion stability of the microgel on emulsion polymerization is deteriorated. When it is more than 100, acrylic resin is liable to be water soluble and, therefore, dispersion stability on emulsion polymerization is deteatioarted. It is preferred that the hydroxyl group value is 5 to 250, preferably 35 to 150. In this range of the hydroxyl group value, stability of microgel on emulsion polymerization becomes good. In the case of preparing the composition for offset printing plate, stability of the microgel to the solvent is improved. Further, in the case of preparing the offset printing plate, compatibility between the binder resin and microgel is enhanced and, therefore, durability and wear resistance of the printing plate are improved.

The molecular weight of the polymeric emulsifer is not specifically limited but is 1,000 to 500,000, preferably 5,000 to 500,000, more preferably 10,000 to 300,000. When the molecular weight is not within the above range, sufficient emulsification ability is not obtained when using it as an emulsifier, dispersibility and storage stability of the microgel becomes inferior, and sufficient performances are not obtained when using it as a composition for offset printing plate.

It is preferred that the polymeric emulsifier is stable to alkali of an alkali developer. Therefore, polyester resin which is affected by the alkali is not preferred. Examples of the suitable polymeric emulsifier include acrylic resin and the like.

As the acrylic monomer which is used for preparing an acrylic resin as the above polymeric emulsifier, for example, there is a reactive monomer which is used for synthesizing the above binder resin. Examples thereof include carboxyl group-containing monomer (e.g. acrylic acid, methacrylic acid, etc.), hydroxyl group-containing monomer (e.g. 2-hydroxyethyl acrylate, hydroxypropyl acrylate, 2-hydroxyethyl methacrylate, hydroxypropyl methacrylate, hydroxybutyl acrylate, hydroxybutyl methacrylate, o-, m-, p-hydroxystyrene, o-, m-, p-hydroxyphenyl (meth)acrylate, etc.), nitrogen-containing alkyl acrylate or methacrylate (e.g. dimethylaminoethyl methacrylate, etc.), polymerizable amide (e.g. acrylamide, methacrylamide, N-methylol methacrylamide, N-ethylacrylamide, N-hexylacrylamide, etc.), polymerizable nitrile (e.g. acrylonitrile, methacrylonitrile, etc.), alkyl acrylate or methacrylate (e.g. methyl acrylate, methyl methacrylate, ethyl acrylate, n-butyl acrylate, n-butyl methacrylate, 2-ethylhexyl acrylate, etc.) and the like.

Further, the reactive vinyl monomer having a terminal carboxyl group represented by the formula:

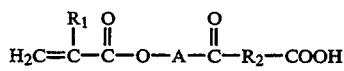

[wherein $R_1$ is hydrogen or a methyl group; $R_2$ is a substituted or non-substituted aliphatic hydrocarbon having 2 to 10 carbon atoms, alicyclic hydrocarbon having 6 to 7 carbon atoms or aromatic hydrocarbon having 6 carbon atoms; A is a repeated unit of the formula:

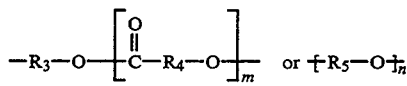

($R_3$ is ethylene or propylene; $R_4$ is a substituted or non-substituted alkylene having 2 to 7 carbon atoms; $R_5$ is a substituted or non-substituted alkylene having 2 to 5 carbon atoms; m and n respectively indicate the average number of the repeated unit, and m is an integer of 1 to 10 and n is an integer of 2 to 50); provided that the terminal carboxyl group may be neutralized with an inorganic or organic base] disclosed in Japanese Patent Kokai No. 63-6009 may be used for preparing the acrylic resin.

The acrylic resin may be prepared by copolymerizing another copolymerizable monomer, in addition to the above monomer. Examples of the other copolymerizable monomer include polymerizable aromatic monomer (e.g. styrene, α-methylstyrene, vinyltoluene, t-butylstyrene, etc.), α-olefin (e.g. ethylene, propylene, etc.), vinyl ether or vinyl ester compound (e.g. vinyl acetate, vinyl propionate, ethyl vinyl ether, phenyl vinyl ether, etc.), diene compound (e.g. butadiene, isoprene, etc.), glycidyl (meth)acrylate and the like.

The acrylic resin as the above polymeric emulsifier may be prepared by a normal solution polymerization method. Examples of the polymerization initiator include organic peroxides (e.g. benzoyl peroxide, t-butyl peroxide, cumene hydroperoxide, etc.), organic azo compounds (e.g. azobiscyanovaleric acid, azobisisobutyronitrile, azobis(2,4-dimethyl) valeronitrile, azobis(2-aminodipropane) hydrochloride, etc.) and the like.

The polymerization conditions are not specifically limited and the polymerization may be conducted at 45° to 95° C. C for 0.5 to 20 hours.

The microgel used in the present invention may be prepared by copolymerizing a monofunctional group with a polyfunctional ethylenically unsaturated monomer.

The monofunctional monomer makes it easy to design physical properties (e.g. Tg, mechanical properties of whole microgel, etc.), chemical resistance, compatibility and the like. Examples of the monofunctional monomer include acrylic monomer as described in the preparation of the above polymeric emulsifier and other copolymerizable monomers. In addition to the above monomers, carboxyl group-containing monomer (e.g. crotonic acid, itaconic acid, maleic acid, fumaric, etc.), hydroxyl group-containing monomer (e.g. allyl alcohol, methallyl alcohol, etc.). and the like may be used.

Further, a reactive monomer having a basic group may be used as the other monofunctional monomer.

As the above reactive monomer having a basic group, any reactive vinyl monomer having amino, or cyclic nitrogen atom, or basic group of onium structure thereof can be advantageously used alone or in combination thereof. Such reactive monomer is definitely classified into the following compound group. For example, they are reactive vinyl monomers having an amino group represented by the formula:

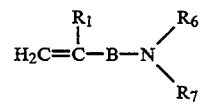

[wherein $R_1$ is hydrogen or a methyl group; $R_6$ and $R_7$ are hydrogen, or a substituted or non-substituted alkyl group having 1 to 4 carbon atoms; B is

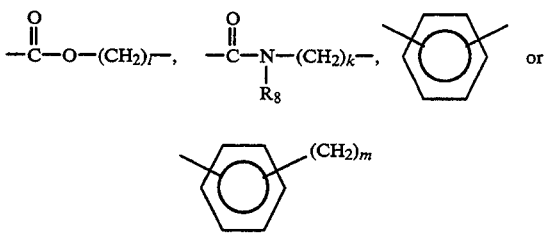

(wherein $R_8$ is hydrogen or an alkyl group having 1 to 4 carbon atoms; k, l and m are respectively indicate an integer of 2 to 6)], Examples thereof include dimethylaminoethyl (meth)acrylate, diethylaminoethyl (meth)acrylate, N-methyl-N-dimethylaminoethyl(meth)acrylamide, dimethylaminostyrene, diethylaminoethylstyrene, dimethylaminovinylpyridine and the like.

The monofunctional monomer can be used alone or in combination thereof. The composition ratio of each monomer may be selected so that the Tg value of the polymer obtained by polymerizing these monofunctional monomer compositions becomes −30° to 90° C., preferably 20° to 80° C. When the Tg value is not in the above range, application propery and developability of the composition as well as printability of the printing plate cannot be sufficiently improved.

By using the polyfunctional monomer to be copolymerized with the above monofunctional monomer, three-dimensional crosslinking occurs at the inside of the microgel. Non-swelling property and insolubility are provided by the internal three-dimensional crosslinking, whereby, physical properties (e.g. Tg and physical properties of whole microgel, etc.) are improved.

The polyfunctional monomer to be used may be any one having at least two radical polymerizable, ethylenically unsaturated groups in a molecule. For the same purpose, the combination of two sorts of ethylenically unsaturated monomers having different groups which can be reacted together may be used. Such polyfunctional monomer may be polymerizable unsaturated monocarboxylate ester of polyhydroxy alcohol, polymerizable unsaturated alcohol ester of polybasic acid, aromatic compound substituted with at least two vinyl groups and the like. Example thereof include ethylene glycol diacrylate, ethylene glycol dimethacrylate, triethylene glycol dimethacrylate, tetraethylene glycol dimethacrylate, 1,3-butylene glycol dimethacrylate, trimethylolpropane triacrylate, trimethylolpropane trimethacrylate, 1,4-butanediol diacrylate, neopentyl glycol diacrylate, 1,6-hexanediol diacrylate, pentaerythritol diacrylate, pentaerithritol triacrylate, pentaerythritol tetraacrylate, pentaerythritol dimethacrylate, pentaerythritol trimethacrylate, pentaerythritol tetramethacrylate, glycerol dimethacrylate, glycerol allyloxydimethacrylate, 1,1,1-trishydroxymethylethane diacrylate, 1,1,1-trishydroxymethylethane triacrylate, 1,1,1-trishydroxymethylethane methacrylate, 1,1,1-trishydroxymethylethane trimethacrylate, 1,1,1-trishydroxymethylpropane diacrylate, 1,1,1-trishydroxymethylpropane triacrylate, 1,1,1-trishydroxymethylpropane dimethacrylate, 1,1,1-trishydroxymethylpropane trimethacrylate, triallyl cyanurate, triallyl isocyanurate, triallyl trimellitate, diallyl terephthalate, diallyl phthalate, divinylbenzene and the like.

As two kinds of monomers respectively having the group which can react together, there are typically epoxy group-containing ethylenically unsaturated monomer (e.g. glycidyl acrylate, glycidyl methacrylate, etc.) and carboxyl group-containing ethylenically unsaturated monomer (e.g. acrylic acid, methacrylic acid, etc.) but are not limited to them. For example, various combinations (e.g. amine and carbonyl, epoxide and carboxylic acid anhydride, amine and carboxylic acid chloride, alkylene imine and carbonyl, organoalkoxy silane and carboxyl, hydroxyl and isocyanate, etc.) have been suggested and they are also included in the present invention.

As the polymerization initiator in the emulsion polymerization, for example, there can be suitably used those described above in the preparation of the polymeric emulsifier, inorganic water-soluble radical initiator (e.g. ammonium persulfate, sodium persulfate, hydrogen peroxide, etc.), azo compound type water-soluble initiator (e.g. redox initiator, azobiscyanovaleric acid, etc.) and the like. As the chain transfer agent, for example, there can be used mercaptans (e.g. ethyl mercaptan, butyl mercaptan, dodecyl mercaptan, etc.), halogenated carbons (e.g. carbon tetrafluoride, carbon tetrachloride, etc.) and the like. In the case of emulsion polymerization, surfactants such as sodium lauryl sulfonate and the like may be added as an additive. In the polymer composition, the weight ratio of the monofunctional monomer to the polyfunctional monomer (monofunctional monomer/polyfunctional monomer) is 30 to 95% by weight/5 to 70% by weight, preferably 30 to 90% by weight/10 to 70% by weight. When the amount of the polyfunctional monomer is less than 5% by weight, the stability of the microgel in the organic solvent is inferior and the swelling rate increases, which results in inferior durability. When the amount is more than 95% by weight, there is a disadvantage that stable microgel particles are scarcely obtained. Further, as the amount of the polyfunctional monomer becomes larger, the resulting microgel becomes harder. The hardness of the microgel can be appropriately adjusted according to the application.

In the emulsion polymerization, various processes can be used for adding dropwise the emulsifier and monomers. For example, they are as follows:

(i) a method comprising placing an acrylic resin as an emulsifier in a vessel and adding dropwise a monomer and an initiator at the same time to proceed polymerization;

(ii) a method comprising mixing an acrylic resin as an emulsifier, a monomer and water to form a W/O or O/W type emulsion and, then adding dropwise an initiator; and (iii) a method comprising neutralizing an acrylic resin as an emulsifier to form an aqueous solution and then adding dropwise a monomer and an initiator at the same time.

Further, it is possible that the microgel takes a structure of core/shell.

For example, there can be used a method comprising adding dropwise a monomer having a composition to be formed as the core part at the first stage and adding dropwise a monomer having a composition to be formed as the shell part at the second stage. The composition of the monomer may be continuously changed like a power feed method. Further, there can also be used an effective method comprising sufficiently reacting a monomer mixture to be formed as the core part at the first stage and then adding dropwise a monomer mixture to be formed as the shell part at the second stage.

It is possible to freely design a physical property and chemical resistance of the microgel by such core/shell structure.

The microgel produced using an aqueous solvent can be isolated by methods such as filtration, spray-drying, freeze-drying and the like and used as it is, or used after it is pulverized to particles having a suitable particle size using a mill, or used after the solvent of the dispersion synthesized is displaced by solvent displacement.

The microgel thus obtained as described above having a particle size of 0.01 to 2.0 $\mu$, particularly 0.1 to 0.8 $\mu$ may be preferably used. When the particle size is smaller than the above range, there is disadvantages that the effect for durabilty is small and viscosity of the composition is extremely enhanced. When it exceeds 2.0 $\mu$, durability is good, however, a uniform film can not be obtained when the composition is coated, and dispersion stability of the microgel is inferior, which results in separation of the microgel and deterioration of light transmission properties.

The photosensitive composition of the present invention contains the above ingredients (I) to (III) and, if necessary, a polymerizable ethylenically unsaturated monomer may be added. As the monomer, those which are used in combination with the above photosensitive substance (II) and photopolymerizable composition may be preferably used. Further, a dye may also be added. The dye formulated as the image colorant may be a color material such as basic dye and oil-soluble dye, which gives good image distinguishability and handling of the plate. Examples thereof include a basic dye such as Victoria Pure Blue BOH, Victoria Blue BH, Methyl Violet, Aizen Malachite Green (hereinabove, manufactured by Hodagaya Chemical K.K.), Patent Pure Blue VX, Rhodamine B, Methylene Blue (hereinabove, manufactured by Sumitomo Chemical Industries K.K.), etc. and an oil soluble dye such as Sudan Blue II, Victoria Blue F4R (hereinabove, manufactured by B.A.S.F), Oil Blue #603, Oil Blue BOS, Oil Blue IIN (hereinabove, manufactured by Orient Chemical Industries K.K.), etc.

The photosensitive resin composition of the present invention may further contain additives, if necessary, such as solvents, fillers, pigments, photo-degradable acid generators, surfactants for improving application property and the like.

In the composition of the photosensitive composition of the present invention, the amount of the ingredients (I) to (III) are as follows, based on 100% by weight of the composition:

(I) Film-forming binder resin; 15 to 99% by weight, (II) Photosensitive substance; 1 to 50% by weight, and (III) Microgel; 0.1 to 35% by weight, preferably, (I) Film-forming binder resin; 50 to 95% by weight, (II) Photosensitive substance; 3 to 30% by weight, and (III) Microgel; 0.5 to 15% by weight.

The photosensitive resin composition of the present invention may be prepared by art-known methods, e.g. mixing the above components with stirring mechanically under light screening.

By using the photosensitive resin composition of the present invention, an offset printing plate can be made. As the method for making the offset printing plate, a conventional method may be used. Firstly, the photosensitive resin composition of the present invention may be coated on a suitable substrate. Examples of the substrate include paper, paper on which a plastic (e.g. polyethylene, polypropylene, polystyrene, etc.) is laminated, aluminum (containing aluminum alloy), plate of metal (e.g. zinc, copper, etc.) plastic film (e.g. cellulose diacetate, cellulose triacetate, cellulose propionate, cellulose acetate, cellulose methyl acetate, cellulose ethyl acetate, cellulose nitrate, polyethylene terephthalate, polyethylene, polystyrene, polypropylene, polycarbonate, polyvinyl acetal, etc.), paper or plastic film on which the above metal is laminated or deposited and the like. Among these substrates, an aluminum plate has excellent dimensional stability and is comparatively lightweight and inexpensive, and it is preferred. A composite sheet wherein an aluminum sheet is bound to a polyethylene terephthalate.-film as described in Japanese Patent Kokoku No. 48-18327.is also preferred.

It is preferred that the substrate having the surface of metal, particularly aluminum is subjected to a hydrophilication treatment.

The coating method is not specifically limited, for example, coating is conducted using a bar coater, followed by drying at 50° to 120 ° C. for 1 to 40 minutes. The amount of coating after drying is about 0.2 to 5 g/m$^2$. If necessary, the resin which is soluble in an alkali developer (e.g. polyvinyl alcohol, hydroxypropyl methylcellulose, etc.) can be further coated, followed by drying to provide an overcoat layer.

The dried coat thus obtained is covered with an image-bearing negative or positive film, exposed to light and then developed according to a normal method to obtain an offset-printing plate. As the light source used for exposure, for example, there are carbon-arc lamp, mercury vapour lamp, xenon lamp, metal halide lamp, strobo, ultraviolet rays, laser rays and the like. Developing is conducted using an alkali depeloper. As the alkalinizing agent formulated in the alkali developer, for example, there are inorganic alkalinizing agents (e.g. sodium silicate, potassium silicate, potassium hydroxide, sodium hydroxide, lithium hydroxide, sodium tertiary phosphate, sodium secondary phosphate, ammonium tertiary phosphate, ammonium secondary phosphate, sodium metasilicate, sodium bicarbonate, ammonia, etc.) and organic amine compounds (e.g. monomethylamine, dimethylamine, trimethylamine, monoethylamine, diethylamine, triethylamine, monoisopropylamine, diisopropylamine, n-butylamines, monoethanolamine, diethanolamine, triethanolamine, monoisopropanolamine, diisopropanolamine, triisopropanolamine, ethyleneimine, ethylenediamine, pyridine, etc.). As the solvent for the alkalinizing agent, for example, water (particularly, deionized water) and the like can be used.

The concentration of the alkalinizing agent may be appropriately selected.

The polymeric emulsifier to be formed as surfactant which attributes to stability of the microgel used in the present invention has good compatibility with the solvent or other resins and, therefore, an interaction between particle and that beween particle and binder is large. Further, since the particle size of the microgel is small, remarkable thixotropy is provided to the photosensitive solution. As a result, there is no problem of storing the coating solution (e.g. precipitation and aggregation of particles, etc.) and no problem on coating (e.g. dewetting, sagging, etc.).

Further, the microgel itself improves printability. However, the microgel in the present invention is covered with an emulsifier having good compatibility with a developer and, therefore, developability is further improved.

Regarding the polymeric emulsifier in the present invention, since the Sp value is adjusted to 9 to 16, a plate having a uniform composition is liable to be obtained even if the microgel is contained and, therefore, it is scarcely damaged by isopropyl alcohol and the like contained in a wetting solution. Further, in the negative photosensitive printing material, hydroxyl group of the polymeric emulsifier is reacted with a diazo photosensitive substance and the microgel is integrated with the binder resin and, therefore, mechanical strength, solvent resistance and ink resistance of the film is improved.

The following Synthesis Examples, Preparation Examples, Examples and Comparative Examples further illustrate the present invention in detail but are not to be construed to limit the scope thereof. In the Synthesis Examples, Preparation Examples, Examples and Comparative Examples, all "parts" are by weight unless otherwise stated.

Synthesis of Polymeric Emulsifier

SYNTHESIS EXAMPLES 1

Methoxypropanol (100 parts) was placed in a 2 liter flask equipped with a stirrer, a nitrogen inlet tube, a thermometer, a tap funnel and a condenser, followed by heating at 90° C. Then, a mixed solution of 2-hydroxyethyl methacrylate (50 parts), n-butyl acrylate (60 parts), methacrylic acid (10 parts), methyl methacrylate (50 parts) and AIBN (azobisisobutyronitrile, 1.9 parts) was added dropwise over 2 hours. After completion of the addition, methoxypropanol (50 parts) was added, and the mixture was maintained at 90° C. with stirring for 30 minutes. Then, a mixed solution of methoxypropanol (50 g) and AIBN (0.5 parts) was added dropwise over 3 hours, followed by stirring for 30 minutes to complete the reaction. The reaction mixed solution was introduced to a large amount of deionized water and the precipitate formed was filtered off. The precipitate was thoroughly washed with deionized water and dried under vacuum to obtain an acrylic binder resin. The resulting resin is that having Sp value of 11.88, hydroxyl value of 107.8, acid value of 32.6, Tg of 30.1, and number average molecular weight of 22,000.

SYNTHESIS EXAMPLES 2 TO 8

By using each monomer shown in Table 1, each resin was obtained according to the same manner as that described in Synthesis Example 1.Sp value, hydroxyl value, acid value, Tg and Mn of the resulting resin is shown in Table 1.

TABLE 1

| | Synthesis Example No. | | | | | | | |
|---|---|---|---|---|---|---|---|---|
| | 1 | 2 | 3 | 4 | 5 | 6 | 7 | 8 |
| Ingredients (parts) | | | | | | | | |
| HEMA[1] | 50 | 46 | 50 | 46 | 46 | 10 | 10 | — |
| AN[2] | — | 15 | 5 | 16 | 16 | 16 | 16 | — |
| IBMA[3] | — | 30 | — | 30 | 20 | 20 | 20 | — |
| MAA | 10 | 8 | — | 8 | 8 | 8 | 4 | 10 |
| AA[5] | — | 1 | 8 | — | — | — | — | — |
| nBA[6] | 60 | — | 37 | — | — | — | — | 25 |
| MMA[7] | 50 | — | — | — | 10 | 46 | 50 | 45 |
| HEA[8] | — | — | — | — | — | — | — | 5 |
| ST[9] | — | — | — | — | — | — | — | 15 |
| Properties | | | | | | | | |
| Sp value | 11.88 | 12.83 | 12.80 | 12.72 | 12.87 | 11.87 | 11.46 | 11.35 |
| Hydroxyl value | 107.8 | 198.3 | 215.5 | 198.3 | 198.3 | 43.1 | 43.1 | 24.1 |
| Acid value | 32.6 | 59.9 | 62.6 | 59.9 | 52.1 | 52.1 | 26.1 | 65.2 |
| Tg | 30.1 | 67.7 | 7.2 | 67.8 | 73.4 | 91.7 | 89.2 | 44.9 |
| Mn | 22,000 | 24,000 | 21,000 | 32,000 | 12,000 | 23,000 | 22,000 | 26,000 |

[1]: 2-Hydroxyethyl methacrylate
[2]: Acryrlnotrile
[3]: Isobutyl methacrylate
[4]: Methacrylic acid
[5]: Acrylic acid
[6]: n-Butyl acrylate
[7]: Methyl methacrylate
[8]: Hydroxyethyl acrylate
[9]: Styrene Preparation of Microgel

PREPARATION EXAMPLE 1

Deionized water (20.0 parts), emulsifier synthesized in Synthesis Example 1 (10 parts) and dimethyl ethanolamine (0.8 parts) were placed in a reaction vessel equipped with a stirrer, a nitrogen inlet tube and a thermometer and the mixture was stirred at 80° C. to form a solution. To this was added dropwise a solution of azobiscyanovarelic acid (1.5 parts), deionized water (30 parts) and dimethyl ethanolamine (1 part) as well as a mixed solution of n-butyl acrylate (45 parts), methyl methacrylate (15 parts) and ethylene glycol dimethacrylate (30 parts) over one hour, followed by stirring for one hour to obtain an aqueous dispersion of resin fine particles. Then, methoxypropanol was added to the aqueous dispersion which was subjeted to solvent displacement to obtain a methoxypropanol dispersion of resin fine particles (nonvolatile content: 23.5%).

Tg of the polymer calculated from the mixture of the monofunctional monomer of the resin fine particles was −28° C., Sp value was 9.7 and average particle size was 0.24 micron.

PREPARATION EXAMPLE 2

By using each ingredient shown in Table 1, a methoxypropanol dispersion of each resin particle (novolac content of 20%) was obtained according to the same manner as that described in Preparation Example 1.

Tg of the polymer calculated from the mixture of the monofunctional monomer, Sp value, hydroxyl value and acid value are shown in Table 2.

TABLE 2

| | Preparation Example No. | | | | | | | |
|---|---|---|---|---|---|---|---|---|
| | 1 | 2 | 3 | 4 | 5 | 6 | 7 | 8 |
| Ingredients (parts) | | | | | | | | |
| Emulsifier (Synthesis Ex. No.) | 10 (1) | 30 (2) | 10 (3) | 10 (4) | 20 (5) | 30 (6) | 10 (7) | 20 (8) |
| EDGMA[1] | 30 | 10 | 54 | 10 | 20 | 10 | 10 | 20 |
| MMA | 15 | 15 | 27 | 36 | 27 | 27 | 56 | 42 |
| nBA | 45 | 45 | 9 | 12 | 9 | 9 | 4 | 3 |
| ST | — | — | — | 16 | 12 | 12 | 16 | 12 |
| HEMA | — | — | — | 12 | 9 | 9 | 4 | 3 |
| MAA | — | — | — | 4 | 3 | 3 | — | — |
| Polyfunctional monomer/monofunctional monomer ratio | 1/2 | 1/6 | 54/36 | 1/8 | 2/6 | 1/6 | 1/8 | 2/6 |
| Properties | | | | | | | | |
| Average particle size (μ) | 0.24 | 0.15 | 0.25 | 0.27 | 0.18 | 0.09 | 0.25 | 0.18 |
| TG[2] | −28 | −28 | 46.9 | 62.3 | 62.3 | 62.3 | 88.2 | 88.2 |

[1]: Ethylene glycol dimethacrylate
[2]: Tg value of the polymer calculated from the mixture of the monofunctional monomer Preparation of Photosensitive Composition and Production of Offset Printing Plate

EXAMPLE 1

By using the microgel prepared in the above Preparation Example 1, a photosensitive composition was prepared according to the following formula.

| Ingredients | Amount (g) |
|---|---|
| Alkali-soluble copolymer[1] | 8.74 |
| Microgel prepared in Preparation Example 1 | 0.46 |
| Diazo resin[2] | 0.8 |
| Victoria Pure Blue BOH | 0.25 |
| Methoxypropanol | 40.00 |

| Ingredients | Amount (g) |
| --- | --- |
| Dimethylformamide | 49.75 |

[1]: Acrylic resin having a molecular weight of 25,000 copolymerized according to the same manner as that described in Synthesis Example 1, using 2-hydroxyethyl methacrylate (100 parts), acrylonitrile (40 parts), i-butyl methacrylate (53 parts) and methacrylic acid (7 parts)
[2]: Diazo resin having a molecular weight of 2,300 of which counter anion is hexafuluoro phosphate The photosensitive composition solution thus obtained was placed in a vessel and allowed to stand for 3 days. As a result, no precipitation or separation were observed and it showed good stability. Further, the photosensitive composition solution was coated on the aluminum plate which had been subjected to a toughening and hydrophilication treatment, using a bar coater, followed by drying at 80° C. for 4 minutes to obtain a negative type PS plate having coating weight of 2 g/m². An application property of the composition was good and uniform, and no foreign particle and cratering were observed.

Then, the photosensitive plate was exposed with a vacuum printer HVP-22H manufactured by Hamaguchi Seiwa Kogyo K.K. (3 kW metal halide lamp manufactured by Eye graphics K.K.) through the negative film at a distance of 1.2 m for 1 minutes and 30 seconds. Then, the exposed plate was developed with a diluted solution (developer/water=1:1) at a developing rate of 80 cm/min and coated with a gumming solution to obtain a lithographic printing plate.

Unexposed area was totally removed in the resulting printing plate. The number of steps was 3 to 11 and it had a good image reproductivity.

Printability Test

Each printing plate thus obtained was mounted to a small offset printer, Hamadastar 700CDX (manufactured by Hamada Insatsukikai Seizosho K.K.) and printed on good quality paper using a commercially available ink. As a result, 150,000 sheets of paper were satisfactorily printed without scumming the non-image area. Particularly, reproductivity of halftone was excellent.

COMPARATIVE EXAMPLE 1

According to the same manner as that described in Example 1 except for using no microgel prepared in Preparation Example 1, a photosensitive composition was prepared. Then, according to the same manner as that described in Example 1, a printing plate was prepared and printability test was conducted.

Stability, application property of the photosensitive composition, and developability and image reproductivity of the printing plate are the same as those of Example 1. When 100,000 sheets of paper were printed in printability test, the result was the same as that of Example 1, however, when 150,000 sheets of paper were printed, reproductivity of halftone was deteriorated.

COMPARATIVE EXAMPLE 2

According to the same manner as that described in Example 1 except that a microgel obtained by using an amphoionic compound shown in Example 2 of Japanese Patent Kokai No. 63-8648 as an emulsifier is used instead of the microgel prepared in Preparation Example 1, a photosensitive composition solution was prepared. The resulting photosensitive composition solution was placed in a vessel and allowed to stand for 3 days. As a result, separation of the microgel was observed. Further, when the solution was coated on an aluminum plate which had been subjected to a roughening and hydrophilication treatment, foreign particle and cratering were slightly observed. It was confirmed that application property is inferior.

EXAMPLE 2

According to the same manner as that described in Example 1 except for using an alkali-soluble acrylic resin having acid value of 54.6, hydroxyl value of 199 and a molecular weight of 22,000, which comprises the following formulation:

| Ingredients | Amount (parts) |
| --- | --- |
| 2-Hydroxyethyl methacrylate | 46 |
| Acryronitrile | 15 |
| i-Butyl methacrylate | 28.9 |
| SPE[1] | 2.5 |
| Methacrylic acid | 7.6 |

[1]: N,N-dimethyl-N-methacrylamidepropyl-N-(3-sulfopropyl)ammonium betaine, Mn = 292 instead of the alkali-soluble copolymer in Example 1 and the microgel obtained in Preparation Example 2, a test was conducted. As a result, the same as that of Example 1 was shown.

EXAMPLE 3

| Ingredients | Amount (parts) |
| --- | --- |
| Cresol-formaldehyde novolac resin | 5.70 |
| Esterified product of naphthoquinone-1,2-diazide-5-sulfonylchloride and pyrogallol-acetone resin (described in Example 1 of the specification of U.S. Pat. No. 3,635,709) | 3.80 |
| Microgel prepared in Preparation Example 3 | 4.80 |
| Victoria Pure Blue BOH | 0.10 |
| Photochromic dye | 0.10 |
| Methoxypropanol | 85.50 |

A photosensitive resin composition obtained by mixing the above ingredients was coated on an aluminum substrate which had been subjected to the same hydrophilication treatment as that of Example 1 using a bar coater so that the coating weight became 2 g/m² after drying at 80° C. for 4 minutes.

Then, this photosensitive plate was exposed with a vacuum printer HVP-22H manufactured by Hamaguchi Seiwa Kogyo K.K. (3 kW metal halide lamp manufactured by Eye graphics K.K.) through a negative film at a distance of 1.2 m for 1 minutes and 30 seconds. Then, by using a automatic processor MPD-306-G manufactured by Dainippon Screen K.K., the exposed plate was developed with a diluted solution (developer for positive plate/water=1:8) at a developing rate of 80 cm/min and coated with a diluted solution (gumming solution/water=1:1) to obtain a lithographic printing plate.

This printing plate was mounted to a small offset printer, Hamadastar 700CDX (manufactured by Hamada Insatsukikai Seizosho K.K.) and printed on good quality paper using a commercially available ink. As a result, 50,000 sheets of paper were satisfactorily printed without scumming the non-image area. The image-area was observed by using an electron microscope. As a result, it was found that the degree of abrasion in the image-area is the same as that before printing.

EXAMPLE 4

| Ingredients | Amount (parts) |
| --- | --- |
| Cresol-formaldehyde novolac resin | 3.80 |
| Styrene-vinylphenol copolymer (styrene content of 85%) | 1.90 |
| Esterified product of naphthoquinone-1,2-diazide-5-sulfonylchloride and pyrogallol-acetone resin (described in Example 1 of the specification of U.S. Pat. No. 3,635,709) | 3.80 |
| Microgel prepared in Preparation Example 4 | 2.40 |
| Victoria Pure Blue BOH | 0.10 |
| Photochromic dye | 0.10 |
| Methoxypropanol | 85.50 |

A photosensitive resin composition obtained by mixing the above ingredients was coated on an aluminum substrate which had been subjected to the same hydrophilization treatment as that of Example 1 using a bar coater so that the coating weight became 2 g/m² after drying at 80° C. for 4 minutes.

According to the same manner as that described in Example 1, a printing plate was prepared and a printing test was conducted. As a result, 50,000 sheets of paper were satisfactorily printed without scumming in the non-image area. The image area was observed by using an electron microscope. As a result, it was found that the degree of abrasion in the image-area is the same as that before printing.

EXAMPLE 5

| Ingredients | Amount (parts) |
| --- | --- |
| Acrylic resin (MW = 200,000, AV = 19) | 2.04 |
| Poly St-MA half ester resin (MW = 20,000, AV = 185) | 1.14 |
| Urethane oligomer | 2.04 |
| Pentaerythritol acrylate | 3.60 |
| Microgel prepared in Preparation Example 5 | 0.48 |
| Polymerization inhibitor | 0.12 |
| Initiator (thioxantene pigment/N-phenyl-glycine/diphenyliodonium chloride | 0.84 |
| Methyl cellosolve | 19.34 |
| EtOH | 19.34 |
| MEK | 46.74 |

Acrylic resin (B723, manufactured by Polyvinyl Chemical Co.)
St-MA half ester (Scripset, manufactured by Monsanto Co.)

A photosensitive solution was coated on an aluminum substrate which had been subjected to the same hydrophilication treatment as that of Example 1 using a bar coater so that the coating weight became 2 g/m² after drying at 80° C. for 4 minutes. Then, 5% polyvinyl alcohol solution (degree of saponification: 88%, degree of polymerization: 500) was coated on this photosensitive layer using a bar coater so that the overcoat layer became 2 g/m² after drying at 60 ° C. for 5 minutes.

The above dried plate was irradiated to 490 nm (light intensity of 4.4 mW/cm²), which was derived from a Xenone lamp (150 W, manufactured by Ushio Denki K.K.) through Toshiba KL-49 filter, through a negative film. Then, it was developed by a commercially available positive PS plate developer and coated with a solution (gumming solution/water=1:1) to obtain a lithographic printing plate.

This printing plate was mounted to a small offset printer, Hamadastar 700CDX (manufactured by Hamada Insatsukikai Seizosho K.K.) and printed on good quality paper using a commercially available ink. As a result, 50,000 sheets of paper were satisfactorily printed without scumming in the non-image area. The image-area was observed by using an electron microscope. As a result, it was found that the degree of abrasion in the image-area is the same as that before printing.

EXAMPLES 6 TO 8

According to the same manner as that described in Example 1 except for using each microgel prepared in Preparation Examples 6 to 8 instead of the microgel, each photosensitive composition was prepared. According to the same manner as that-described in Example 1, a negative PS plate was prepared and a printing test was conducted. In both cases, dispersion stability of the composition solution is excellent and application property is not inferior, and a printing plate showed excellent image reproductivity.

Further, excellent printability and halftone reproductivity were show in a printing test.

What is claimed is:

1. A photosensitive composition for offset printing which comprises an admixture of:
   (I) 15 to 99% by weight of a film-forming binder resin,
   (II) 1 to 50% by weight of a photosensitive substance, and
   (III) 0.1 to 35% by weight of a three-dimensionally crosslinked microgel having a particle size of 0.01 to 2.0 μ prepared by emulsion polymerization using a polymeric emulsifier, based on 100% by weight of the composition, wherein said polymeric emulsifier is acrylic resin containing a carboxyl group as an acidic group, which has an Sp value of 9 to 16, an acid value of 15 to 100 and a hydroxyl group value of 5 to 250.

2. The photosensitive composition for offset printing according to claim 1, wherein said microgel is prepared from a monomer composition comprising 5 to 70% by weight of a polyfunctional ethylenically unsaturated monomer and 30 to 95% by weight of a monofunctional ethylenically saturated monomer to produce a polymer having a Tg value, calculated from the monofunctional monomer, in the range of −30° to 90° C.

3. The photosensitive composition for offset printing according to claim 1, wherein said photosensitive substance (II) is diazo resin.

4. The photosensitive composition for offset printing according to claim 1, wherein said photosensitive substance (II) is quinonediazide resin.

5. The photosensitive composition according to claim 1, wherein said photosensitive substance (II) is photopolymerizable composition.

* * * * *